FIELD EFFECT TRANSISTOR HAVING GRAIN BOUNDARY THEREIN

Filed Nov. 18, 1959 2 Sheets-Sheet 1

WILLIAM SHOCKLEY
*INVENTOR.*

*BY*
Flehr and Swain
ATTORNEYS

March 24, 1964 W. SHOCKLEY 3,126,505

FIELD EFFECT TRANSISTOR HAVING GRAIN BOUNDARY THEREIN

Filed Nov. 18, 1959 2 Sheets-Sheet 2

WILLIAM SHOCKLEY
*INVENTOR.*

*BY*
Flehr and Swain
ATTORNEYS

3,126,505
FIELD EFFECT TRANSISTOR HAVING GRAIN BOUNDARY THEREIN

William Shockley, Los Altos, Calif., assignor to Clevite Corporation, Cleveland, Ohio, a corporation of Ohio
Filed Nov. 18, 1959, Ser. No. 853,905
4 Claims. (Cl. 317—235)

This invention relates generally to a unipolar or field effect transistor.

In general, field effect transistors include a body of one conductivity type having source and drain connections. A voltage is applied between the source and drain contacts. The field set up by the voltage causes carriers to flow from the source to the drain connection. One or more regions of opposite conductivity type forming a junction with the body are provided between the source and drain connections. The portion of the body adjacent the p-n junction is commonly referred to as the channel. The effective cross-sectional area of the channel is controlled by applying a reverse voltage to the p-n junction to cause the space charge layer at the junction to expand and contract into the channel thereby controlling the effective cross-sectional area of the channel. By controlling the effective area, the flow of carriers between source and drain is controlled. A signal to be amplified is applied to the gate regions to thereby modulate the effective cross-sectional area of the channel region whereby the flow of carriers in the body is controlled. Amplification is obtained so that a relatively small signal can control substantial power flowing through the channel.

One of the drawbacks of prior art devices is that the effective channel length is relatively long. As a consequence, control is lost when the frequency of the input wave is comparable to the drift time of carriers along the channel.

It is a general object of the present invention to provide an improved field effect transistor.

It is another object of the present invention to provide a field effect transistor in which the channel length is comparable to the channel width.

It is still a further object of the present invention to provide a field effect transistor in which the gate regions are formed along a grain boundary extending across the channel.

These and other objects of the invention will become more clearly apparent from the following description when taken in conjunction with the accompanying drawing.

Referring to the drawing.

Figure 1:
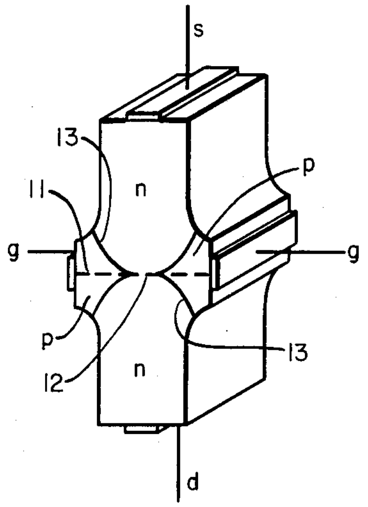
FIGURE 1 shows a grain boundary gate transistor in accordance with the present invention.

The device shown in FIGURE 1 includes a body of semi-conductive material of one conductivity type, for example, n-type, having a grain boundary 11 extending across the same. Diffusion regions of opposite conductivity type, for example, p-type, are formed at the grain boundary and extended deeper into the body at the boundary. Thus, there is formed a channel 12 which is relatively short since the gate regions converge along a sharp edge. A suitable ohmic source connection *s* is made to one end of the n-type body, and an ohmic drain connection *d* is made to the other end of the n-type body. Ohmic gate connections *g* are made to the p-type diffusion regions on opposite sides of the device.

Figure 2:
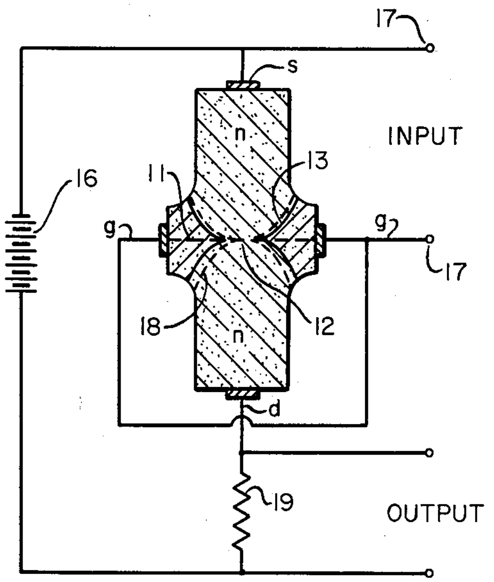
FIGURE 2 is a sectional view schematically illustrating the space charge layer within the channel.

Referring to FIGURE 2, a voltage source 16 is shown connected between the source and drain connections to cause a drift of carriers through the channel region 12. The input signal is applied across the terminals 17 and serves to modulate the space charge layer 18. An output signal is derived across the load 19 which may, for example, be a resistive load. It is noted that the space charge layers extend towards each other in the region of the grain boundary and that the length of the channel is comparable to the width of the channel.

A device of the type shown in FIGURES 1 and 2 may be constructed as shown in FIGURES 3A–E. A wafer 21 of n-type semiconductive material having a grain boundary 11 extending through the same is selected. Wafers 21 having grain boundaries therein may be cut from a crystal in which the boundaries are formed as imperfections during the growing process. Crystals having grain boundaries can be grown from a melt by employing a pair of seed crystals disposed adjacent to one another and having the proper orientation. As the seeds are withdrawn, a crystal having a boundary is formed.

A particularly favorable grain boundary for diffusion to produce the structures in this disclosure is that discussed in copending applications Serial No. 646,625, filed March 18, 1957, now Patent No. 2,979,427 and Serial No. 646,-728, filed March 18, 1957, now Patent No. 2,954,307. Such a grain boundary is a so-called small angle grain boundary and is composed of an array of edge dislocations which extend across the same. The edge dislocations may be many atom planes apart so that they represent a relatively small disturbance in the perfection of the crystal structure.

Figure 3:
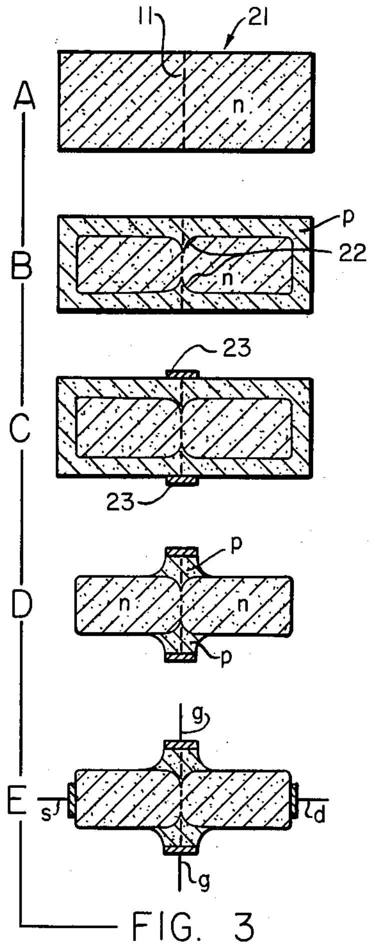
FIGURE 3 shows the steps forming a device of the type shown in FIGURE 1.

The wafer 21 having the grain boundary 11 extending across the same is then subjected to a diffusion process wherein material of an opposite conductivity type is diffused into the wafer as indicated in FIGURE 3B by the p-type layer formed over the surface of the n-type wafer. As is well known, diffusion in crystals takes place more readily along grain boundaries than it does through the bulk of the crystal. It is believed that this is due to the misfit between atoms on a grain boundary. A degree of looseness in the packing (fitting) together of the atoms at the grain boundary gives more room for atoms of the diffusing material to move past the atoms which make up the crystal. As a result, the diffusion penetrates more deeply into the wafer at the grain boundaries as indicated by the ridges 22, FIGURE 3B.

In a small angle grain boundary of the type discussed above, diffusion proceeds most readily in the direction of the edge dislocations. The dislocations in the channel region are perpendicular to the direction of electric flow and may contribute to a reverse current across the gate region. However, the successful operation of diodes and transistors in structures containing dislocations indicates that no major adverse effect should be expected from the presence of a few dislocations.

It has been established that grain boundaries composed of widely spaced edge dislocations can be caused to move under the application of mechanical stresses. It is thus possible to form a diffusion structure like that discussed in FIGURE 2 and then the dislocations composing the grain boundary can be caused to move out of the working region under the influence of stress. In this way it is possible to make a diffusion structure using the grain boundary for preferred diffusion but not have the grain boundary in the working region (channel) when the device is subsequently completed.

Predetermined regions of the crystal shown in FIGURE 3B are then suitably masked as, for example, by oxide masking. The mask illustrated is in the form of bands 23, FIGURE 3C, extending across the crystal.

The crystal is then placed in a suitable etching solution whereby material is etched away as shown in FIGURE 3D to provide the n-type portions having p-type gates. Suitable etching solutions and procedures are well known in the art and will, therefore, not be further described here.

The masking material is then removed and suitable source *s*, drain *d*, and gate *g* ohmic contacts formed with the various regions of the crystal in accordance with conventional methods of making ohmic contacts to a semiconductive body.

There is, thus, provided a semiconductive device having a body with source and drain connections and with gate regions forming a p-n junction with the body and having portions which extend deeper into the body along the grain boundary to define a relatively short channel whose width may be controlled by controlling the time of diffusion into the crystal.

In certain instances, for example, where greater power is to be controlled, it may be desirable to provide a semiconductive device having a plurality of channels. Referring to FIGURES 4A–F, the steps in forming such a device are schematically illustrated. Thus, a p-type wafer having a grain boundary 31 extending parallel to its faces is cut from a crystal having a grain boundary. The wafer is then subjected to a diffusion in the presence of donors to form a p-type layer 32 which is of a higher impurity concentration, FIGURE 4B. The wafer is then masked and suitably etched to provide a series of ridges 32 and valleys 33, FIGURE 4C. The valleys 33 extend deep into the crystal, past the grain boundary 31.

Figure 4:
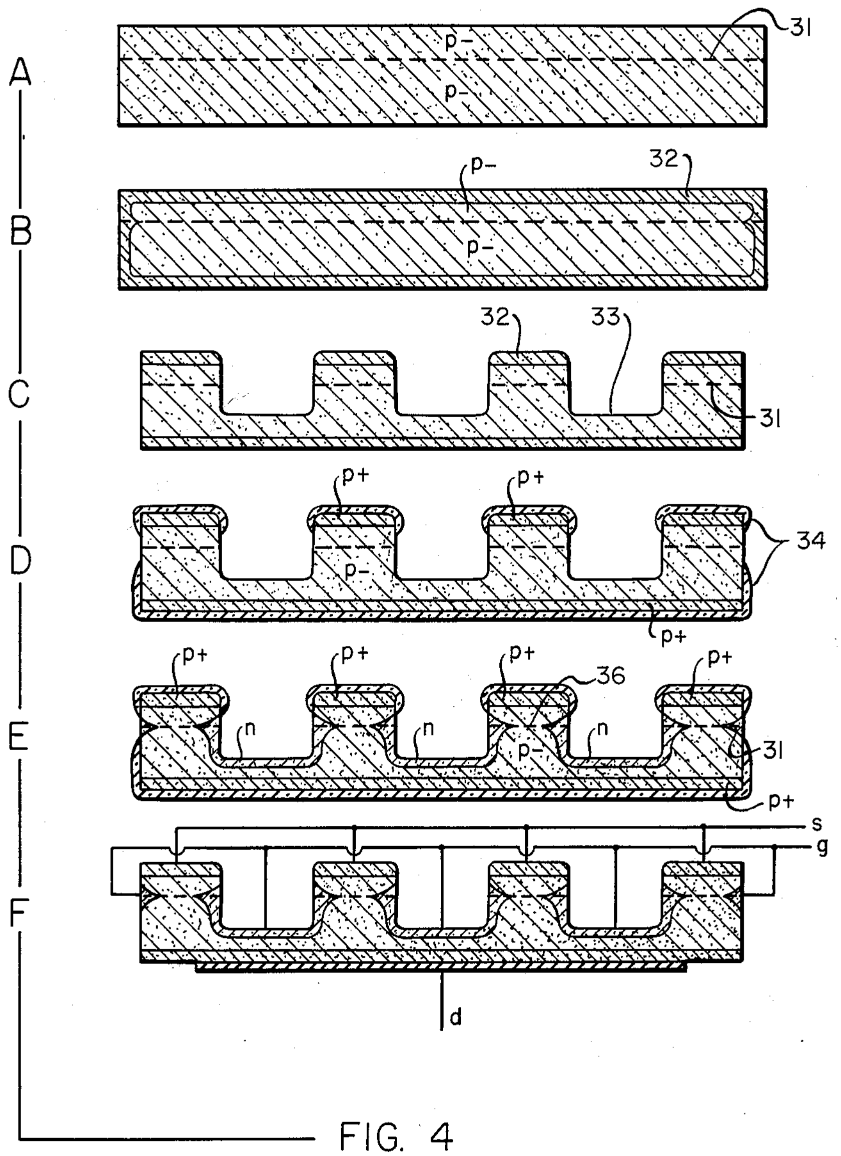
FIGURE 4 shows a multi-channel field effect transistor and the steps in forming the same.

The wafer is then suitably masked as, for example, by oxide masking as indicated in FIGURE 4D whereby the complete exterior of the body is masked with the masking extending downwardly along the sides of the grooves 32 for a small distance. The masking material 34 is shown in FIGURE 4D. The wafer is then subjected to a diffusion in the presence of donors to form an n-type region as indicated in FIGURE 4E. The n-type diffusion region forms a layer at the bottom of the grooves and diffuses more rapidly along the grain boundary 31. The more rapid diffusion extends deeper into the crystal to form short channels 36, as previously described.

The wafer is then cleaned and suitable ohmic connections made to the more heavily doped p+ material to form source and drain connections as shown. It should be understood that the device will operate satisfactorily without a p+ layer adjacent the source and drain ohmic contacts. However, a structure of the type illustrated will have reduced source resistance. Suitable gate connections can be made to the n-type regions at the valleys 33. A plurality of devices which can be operated in parallel are provided.

I claim:

1. A field effect transistor comprising a body of semiconductive material of one conductivity type having a grain boundary therein, and gate regions of opposite conductivity type diffused into said body to form a junction therewith and extending deeper into the body at the grain boundary, the portion of said gate regions extending towards one another along the grain boundary defining a relatively short channel of said one conductivity type, in the body of semiconductive material, source and drain connections made to the body on opposite ends of said channel and diffused gate connections made to the gate regions.

2. A unipolar transistor comprising a body of semiconductive material of one conductivity type having a grain boundary therein which extends between opposite surfaces of the device and gate regions of opposite conductivity type diffused into said body in regions of the body where the boundary extends to the surface, said regions of opposite conductivity type diffused deeper into the wafer at the grain boundary to define a relatively short narrow channel of said one conductivity type in the body of semiconductive material, source and drain connections made to the body on opposite ends of said channel and gate connections made to the diffused gate regions.

3. A field effect transistor comprising a body of semiconductive material of one conductivity type having a grain boundary therein, a plurality of ridges and valleys formed on one surface of said body with the valleys extending into the body deeper than the grain boundary, diffusion regions of opposite conductivity type formed along the valleys and extending deeper into the crystal along the grain boundary, the portion of said diffusion regions extending towards one another forming a relatively short channel, source connections made to the plurality of ridges, a drain connection made to the other surface of said body, and gate connections made to the gate regions.

4. A field effect transistor comprising a body of semiconductive material of one conductivity type having a small angle grain boundary including edge dislocations therein, and gate regions of opposite conductivity type formed by diffusion along the grain boundary in the direction of the dislocations to form a rectifying junction with the body of said one conductivity type, said gate regions extending towards one another to form a relatively short channel of said one conductivity type, source and drain connections made to opposite ends of said channel and gate connections made to said gate regions.

References Cited in the file of this patent

UNITED STATES PATENTS

| | | |
|---|---|---|
| 2,795,742 | Pfann | June 11, 1957 |
| 2,813,326 | Liebowitz | Nov. 19, 1957 |
| 2,836,878 | Shepard | June 3, 1958 |
| 2,869,055 | Noyce | Jan. 13, 1959 |
| 2,904,704 | Marinace | Sept. 15, 1959 |
| 2,954,307 | Shockley | Sept. 27, 1960 |
| 2,979,427 | Shockley | Apr. 11, 1961 |